United States Patent
Kim et al.

(10) Patent No.: US 6,362,109 B1
(45) Date of Patent: Mar. 26, 2002

(54) OXIDE/NITRIDE ETCHING HAVING HIGH SELECTIVITY TO PHOTORESIST

(75) Inventors: Yungsang Kim, San Jose, CA (US); Takehiko Komatsu, Ichikawa Chiba (JP); Claes H. Bjorkman, Mountain View; Hongqing Shan, Cupertino, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/585,632

(22) Filed: Jun. 2, 2000

(51) Int. Cl.[7] .......................... H01L 21/3065
(52) U.S. Cl. ............... 438/706; 438/710; 438/712; 438/714; 438/719
(58) Field of Search .................... 438/706, 710, 438/713, 714, 723, 725; 216/67, 74; 252/79.1, 79.3

(56) References Cited

U.S. PATENT DOCUMENTS 5,770,098 A * 6/1998 Araki et al. ............... 216/67
6,051,504 A * 4/2000 Armacost et al. ........ 438/706
6,159,862 A * 12/2000 Yamada et al. ........... 438/712
6,165,375 A * 12/2000 Yang et al. ............... 216/67

* cited by examiner

Primary Examiner—Benjamin L. Utech
Assistant Examiner—Lan Vinh
(74) Attorney, Agent, or Firm—Charles Guenzer; Joseph Bach

(57) ABSTRACT

A single-step plasma etch process for etching both oxide and nitride selectively to photoresist and silicon. The etching gas includes a fluorocarbon, difluoromethane, oxygen, and carbon monoxide. The fluorocarbon is preferably hydrogen free. Preferred fluorocarbons are hexafluorobutadiene ($C_4F_6$), octafluorocyclobutane ($C_4F_8$), and carbon tetrafluoride ($CF_4$), of which $C_4F_6$ is the most preferred. Approximately equal amounts are supplied of the fluorocarbon, difluoromethane, and oxygen and a significantly larger amount of carbon monoxide. The chemistry is also applicable to etching organo silicate glass selectively to photoresist.

23 Claims, 2 Drawing Sheets

OXIDE/NITRIDE ETCHING HAVING HIGH SELECTIVITY TO PHOTORESIST

FIELD OF THE INVENTION

The invention relates generally to plasma etching. In particular, the invention relates to a method of etching oxide and other dielectric layers, such as nitride layers, in semiconductor integrated circuits.

BACKGROUND ART

Modern silicon integrated circuits contain millions to tens of millions of interconnected semiconductor devices. Such a high level of integration has been achieved, at least in part, by decreasing the minimum feature sizes and by providing multiple wiring layers of horizontally extending metallization lines. Dielectric layers separate the horizontal parts of the wiring layers, which are selectively connected with small-area vertical metallization interconnects. After holes for such vertical interconnects are etched in the dielectric layer, they are filled with a metallization, such as tungsten, thereby forming the vertical connection. Often for upper inter-metal connections, aluminum or copper is simultaneously filled in the hole and also forms the horizontal interconnections above the dielectric layer. In the case of a dielectric layer separating a silicon substrate having active semiconductor areas with a first-level metallization layer, the dielectric is called a first-level dielectric (FLD) and the vertical interconnect is called a contact. When the dielectric separates two metallization layers, the dielectric is called an inter-metal dielectric (IMD) and the vertical interconnect is called a via. This invention will be primarily described with respect to the formation of the contact holes by dry plasma etching, but many of the features of the invention apply as well to vias and to other more complex structures.

The dielectric layers have conventionally been composed of a silica-based oxide, whether it is silicon dioxide grown in a plasma CVD process using TEOS or other precursor, or a borophospho silicate glass (BPSG) deposited using sub-atmospheric CVD (SACVD), or other dielectric materials. More recently, low-k dielectric materials have been developed for use as inter-level dielectrics. One is a fluorosilicate glass (FSG) having a fluorine concentration of 5 to 12 atomic %. The lower dielectric constants of these materials offer the possibility of reduced capacitive coupling between horizontally or vertically adjacent lines, thus reducing cross talk, power consumption, and signal rise time. Low-k dielectrics have been proposed having varying compositions, some silicon-based, and other carbon-based. One such class of low-k dielectrics involves an organo-silicate glass, which will be described in some more detail below.

As will be explained below, etching of the via or contact holes in advanced structures presents increasing difficulty because of the decreasing widths and increasing aspect ratios of the holes. Furthermore, the structures are becoming more complex to allow the formation of dense, complicated circuits with a minimum number of steps. Some of these structures have imposed difficult requirements upon the etching process.

One such advanced structure is a multi-level direct contact (DC), illustrated in cross section in FIG. 2, which is used in most modern designs for dynamic random access memories (DRAMs). A semiconducting silicon substrate 10, as illustrated in FIG. 1, has formed in its surface unillustrated doped regions and other structure for use as active devices in the memory circuit. A polysilicon line 12 is deposited over the silicon substrate 10 to thickness of about 250 nm and etched to a width in the range of 0.1 to 0.25 $\mu$m to act as a transistor gate. A silicon nitride layer is deposited approximately conformally over the polysilicon line 12 as a top portion 14 over the polysilicon line and possibly on the sides as spacers 15. The nitride acts as a either a spacer or as an etch mask for patterning polysilicon. Nitride is a somewhat generic term for compositions close to $Si_3N_4$, but a wider compositional range is given by $SiN_x$ with $1 \leq x \leq 1.5$.

The first-level dielectric layer is deposited in two parts. The lower part is a BPSG layer 16 of about 950 nm of borophospho silicate glass (BPSG), which can be deposited by low-pressure CVD (LPCVD) or atomspheric pressure CVD (APCVD). The upper part is a TEOS layer 18 of about 100 nm of TEOS oxide, which can be deposited in a low-temperature process by plasma-enhanced chemical vapor deposition (PECVD) using tetraethyl orthosilicate (TEOS) as the precursor gas. Both these materials are composed of silicon dioxide but with somewhat different compositions and additives, The relatively thin TEOS layer 18 is included as an adhesion layer as well as a diffusion barrier. An oxide layer is one having a composition generally corresponding to silica or $SiO_2$ but it also includes doped silica such as borophosphosilicate glass (BPSG) and other spin-on glasses (SOGs) and fluorosilicate glass (FSG) among other silica-based low-k dielectrics.

A photoresist layer 18 is deposited on the first level dielectric layers 16, 18 to a thickness of about 550 nm and is photographically patterned with pairs of masking apertures 22, 24. Greater thicknesses of photoresist would degrade the photographic patterning of such small apertures so that a minimum level of selectivity to photoresist is required during the oxide and nitride etching. The critical dimension of these structures is 0.20 to 0.35 $\mu$m or less so that a deep ultra-violet (DUV) photoresist is needed for patterning with the shorter-wavelength DUV light. DUV photoresist sometimes presents a problem when it is applied over other unillustrated surface structure having deep, narrow gaps because it may need to be reflowed, that is, heated after it is spun on, so that it fills the gaps. Reflowed photoresist tends to be patterned with necked apertures that flare outwardly both at the bottom but more particularly at the top. The top flaring can be characterized as facets 26 formed on the top corners of the photoresist. During most conventional etching processes, the photoresist is etched most strongly at its corners so that photoresist facets form and grow even when they are not initially present. If the facets reach the layers being etched, the critical dimension is lost. Photoresist faceting is considered the most likely cause of loss of critical dimension when very narrow holes are being etched. Reflowed DUV photoresist presents an even greater challenge because of the necking incurred in developing of the photoresist even before the etching.

The patterned wafer is then etched to form, as illustrated in the cross-sectional view of FIG. 2, a poly contact hole 10 and a silicon contact hole 32 of two different depths. The etching process must reach through the two different types of oxide 16, 18, also etch through the nitride 14 but stop on the polysilicon 12 and silicon 10. The requirement of selectivity to silicon (including polysilicon), however achieved, is intensified because a common etching process is etching through two substantially different thicknesses of oxide. Furthermore, the holes being etched have high aspect ratios, more than 4:1 for 0.3 $\mu$m holes and 10:1 for 0.13 $\mu$m holes being contemplated.

The process must also be sufficiently selective to the photoresist. Photoresist selectivity has always been a concern in oxide etching, but nitride selectivity has usually been a greater concern. However, it appears that for very narrow structures, the photoresist selectivity will be the most difficult requirement imposed on the oxide etch. A further problem is that under some conditions vertically extending striations form in the photoresist sidewalls and these striations can propagate into the underlying oxide as the etching continues. A striated contact hole of high aspect ratio is very difficult to fill with metallization.

A multi-step process is possible in which the different oxide and nitride levels are sequentially etched. However, in the interest of simplicity and throughput, it is preferred if possible to perform a one-step etch or at least one not involving a great change in processing conditions through the etch step.

Recent developments have shown that a fluorocarbon plasma can etch holes in oxide with aspect ratios up to about 5:1 with very high selectivity to nitride if a heavy hydrogen-free fluorocarbon is used in combination with a larger fraction of a carrier gas. The fluorocarbon should have a low-F/C ratio, such as hexafluorobutadiene ($C_4F_6$). Argon is the conventional carrier gas for plasma etching, but even better nitride selectivity without etch stop is obtained if xenon is used as the carrier gas in combination with the heavy fluorocarbons.

Other fluorocarbon etching recipes are also popular, including ones based on carbon tetrafluoride ($CF_4$) and octafluorocyclobutane ($C_4F_8$). If possible, it would be desirable to develop a suitable recipe relying on these more conventional fluorocarbon etchants.

It is desirable that the process be practiced on a conventional capacitively coupled etch reactors, often referred to as diode reactors, and preferably including magnetic enhancement of the plasma. An example of such a magnetically enhanced reactive ion etch (MERIE) reactor 40 is schematically illustrated in FIG. 3. Similar reactors are available from Applied Materials of Santa Clara, Calif. The reactor 40 includes a grounded vacuum chamber 42, perhaps including liners to protect the walls. A wafer 44 is inserted into the chamber 42 through a slit valve opening 46 and placed on a cathode pedestal 48 with an electrostatic chuck 50 selectively clamping the wafer. The chuck powering is not illustrated. Unillustrated fluid cooling channels through the pedestal 48 maintain the pedestal at reduced temperatures. A thermal transfer gas such as helium is supplied to unillustrated grooves in the upper surface of the pedestal 48. The thermal transfer increases the efficiency of thermal coupling between the pedestal 48 and the wafer 44, which is held against the pedestal 48 by the electrostatic chuck 50 or an alternatively used peripheral wafer clamp.

An RF power supply 52, preferably operating at 13.56 MHz, is connected to the cathode pedestal 48 and provides the only significant power for generating the plasma while also controlling the DC self-bias. Magnetic coils 54 powered by unillustrated current supplies surround the chamber 42 and generate a slowly rotating (on the order of seconds and almost always greater than 10 ms), horizontal, essentially DC magnetic field in order to increase the density of the plasma. A vacuum pump system 56 pumps the chamber 42 through an adjustable throttle valve 58. Shields 60, 62 not only protect the chamber 42 and pedestal 48 but also define a baffle 64 and a pumping channel 66 connected to the throttle valve 58.

Processing gases are supplied from gas sources 68, 70, 72, 74 through respective mass flow controllers 76, 78, 80, 82 to a quartz gas distribution plate 84 positioned in the roof of the chamber 42 overlying the wafer 44 and separated from it across a processing region 86. The composition of the etching gas is a subject matter of one aspect of the present invention. The distribution plate 84 includes a manifold 88 receiving the processing gas and communicating with the processing region 86 through a showerhead having a large number of distributed apertures 90 so as to inject a more uniform flow of processing gas into the processing region 86.

SUMMARY OF THE INVENTION

The invention includes a plasma process for etching oxide and nitride in a one-step process using a principal fluorocarbon etching gas, oxygen, and added polymerizing components of difluoromethane and carbon monoxide, thereby achieving high selectivity to silicon and photoresist.

The preferred fluorocarbons have F/C ratios of no more than 2, and more preferably no more than 1.6. The most preferred fluorocarbon is hexafluorobutadiene ($C_4F_6$) although good results are also obtained with octafluorocyclobutane ($C_4F_8$). However, carbon tetrafluoride ($CF_4$) is also effective.

The fluorocarbon, oxygen, and difluoromethane are present in approximately equal amounts. The carbon monoxide is present in a much larger amounts.

The process is preferably performed at high chamber pressures and high magnetic field.

The chemistry is also effective in etching organo-silicate glasses, and in particular to etch such glasses selectively to silicon carbide (SiC).

DETAILED DESCRIPTION OF THE PREFERRED EMBODIMENTS

Figure 1:
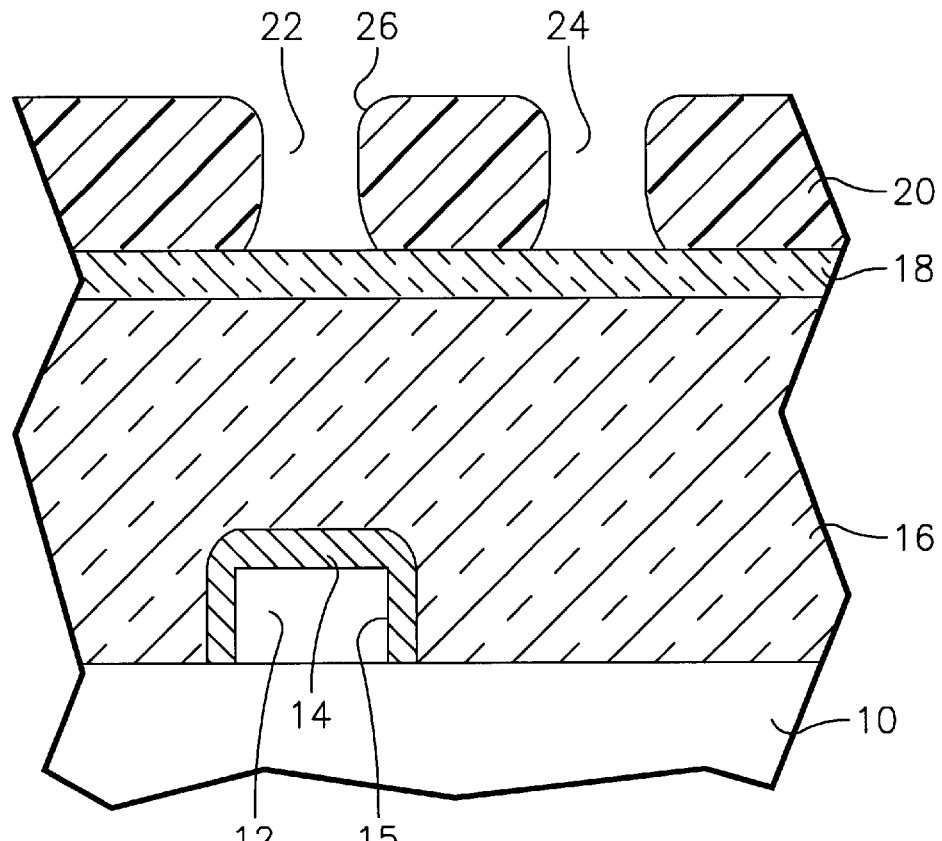
FIGS. 1 and 2 are cross-sectional views of a bi-level contact structure and how it is developed.
Figure 2:
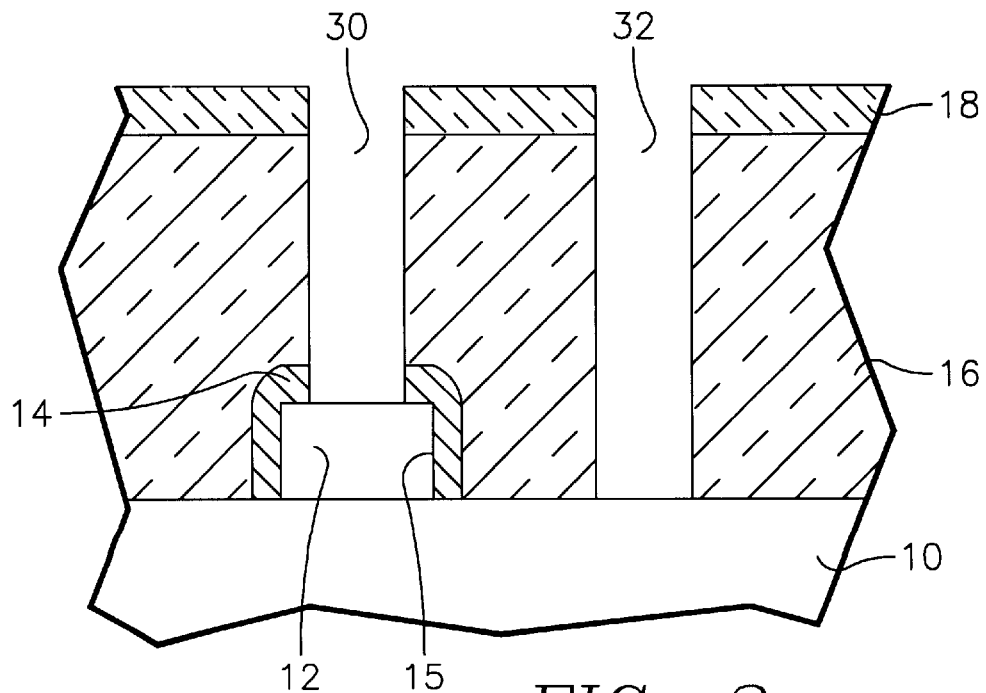
Figure 4:
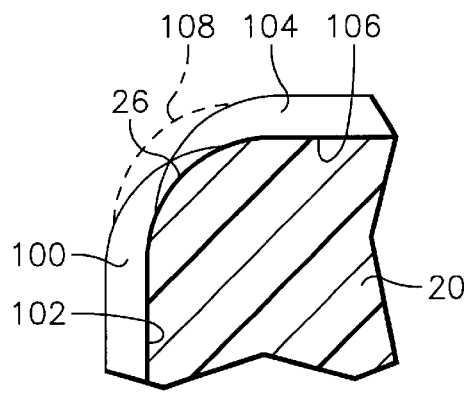
FIG. 4 is a schematic cross-sectional illustration of the build up of polymer on a photoresist facet.
Figure 3:
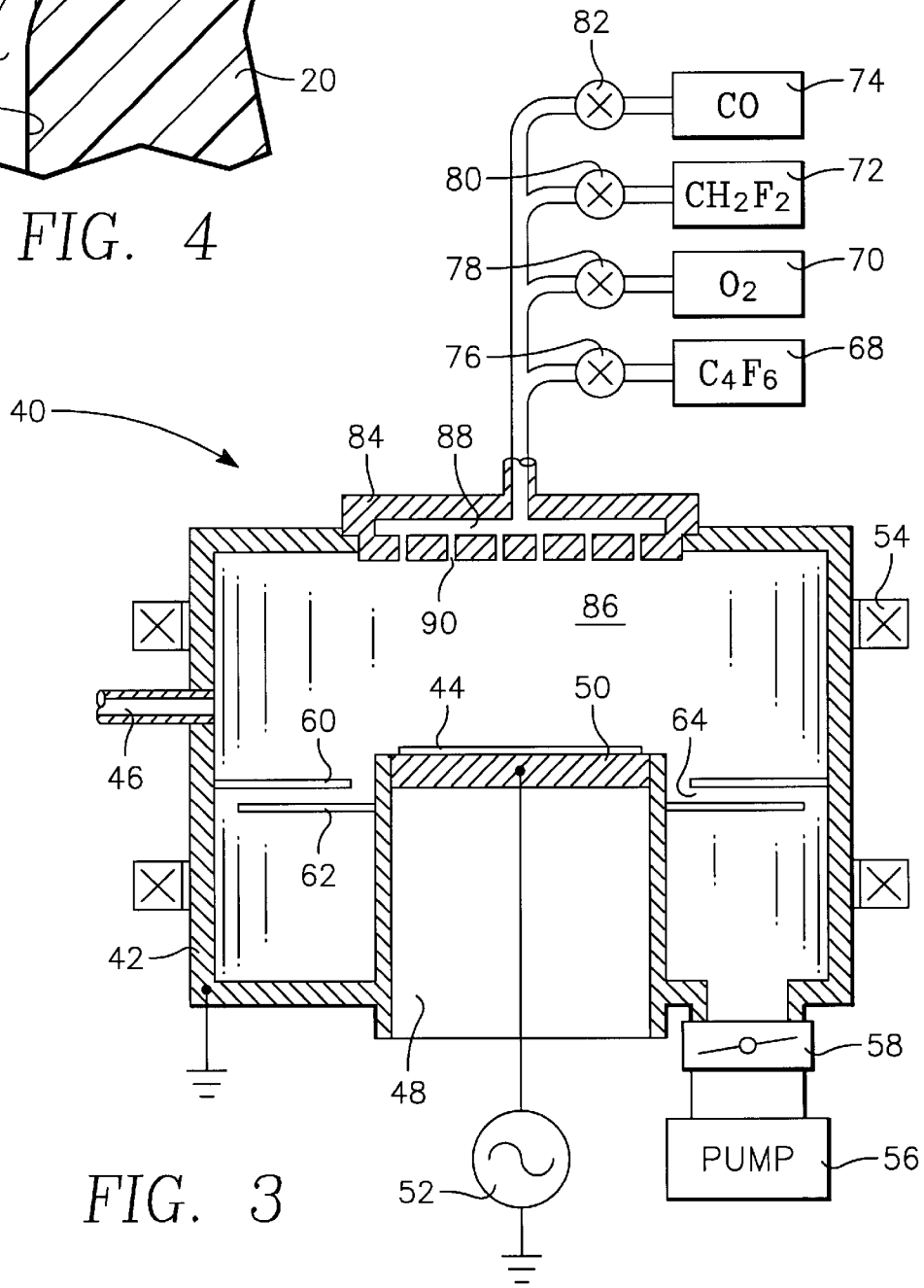
FIG. 3 is a schematic illustration of a magnetically enhanced capacitively coupled plasma etch reactor.

An etching gas of a fluorocarbon and oxygen with a flow of an inactive diluent gas such argon is well known for etching holes in oxide with high aspect ratios, often with a relatively high selectivity to nitride. According to one embodiment of the invention, this conventional combination is changed by adding difluoromethane ($CH_2F_2$) rind carbon monoxide (CO) and eliminating the argon. Although the invention is not limited by our understanding of its theory of operation, we believe that these additive gases perform a number of functions. They reduce the selectivity to nitride, permitting a one-step oxide/nitride etch. The additives seem particularly advantageous for the patterned reflowed DUV resist 20, which as illustrated in the exploded cross-sectional view of FIG. 4, suffers from a severe facet 26 even before etching. We believe that the CO causes a polymer coating 100 to form predominantly on the sidewalls 102 of the patterned photoresist 20 and that the $CH_2F_2$ causes a polymer coating 104 to form on a top surface 106 of the photoresist 20. The result is a total polymer coating 108, shown in dotted line, that is less faceted than the underlying photoresist facet 26. The polymer coatings 100, 104 can be considered as additions to the photoresist 20 since they are all composed of a carbon-based polymer. The smaller net facet, as a result, improves the photoresist selectivity. Furthermore, the CO-induced sidewall polymer coating 100 protects the photoresist sidewall 102 from the formation of striations. On the other hand, the $O_2$ reduces the growth of sidewall polymer, particularly deep in the hole.

Recipes have been developed for a number of fluorocarbons and for one hydrofluorocarbon. Of these, the recipe for hexafluorobutadiene ($C_4F_6$), summarized in TABLE 1 together with some measurements, seems to give the best overall results.

TABLE 1

| | |
|---|---|
| $C_4F_6$ Flow (sccm) | 10 |
| $O_2$ Flow (sccm) | 10 |
| $CH_2F_2$ Flow (sccm) | 10 |
| CO Flow (sccm) | 200 |
| Bias Power (W) | 1600 |
| Magnetic Field (G) | 60 |
| Pressure (mT) | 70 |
| Etch Rate (nm/min) | 500 |
| Photoresist Selectivity | 10 |
| Striations | none |

The etch is actively monitored for its end point, and the etch continues for a 50% over-etch period. The etch rate is a little low, and some bowing is observed in the nitride layer. Otherwise, the results appear superior. The selectivity over nitride is about 1.5 so that the nitride is etched though somewhat slower than the oxide. A selectivity to nitride of no more than 5 is preferred for the described structure. The selectivity over silicon, whether polysilicon or crystalline, is over 20:1. Note that there is no argon diluent gas. We observe that including argon decreases the photoresist selectivity. This aspect of the invention differs significantly from recipes based on $C_4F_6$ or other heavy fluorocarbon designed to etch oxide selectively to both nitride and photoresist and which include a very high fraction of argon and usually no carbon monoxide.

The recipe of TABLE 1 is characterized by the $C_4F_6$, $O_2$, and $CH_2F_2$ being present in the proportions of 1:1:1. A preferred range for these proportions is that the ratio of any two of these is between 1:4 and 4:1 and more preferably between 1:2 and 2:1. The recipe is also characterized as the CO being present to 20 times that of the other components. A reasonable range for CO is that it be present in a ratio of between 5 and 50 relative to all other components. The recipe is also characterized as not containing argon, at least no more than any of the other components.

A second recipe, summarized in TABLE 2, was developed for octafluorocyclobutane ($C_4F_8$) as the primary etchant. This heavy fluorocarbon has an F/C ratio of 2 and is currently widely used in the industry.

TABLE 2

| | |
|---|---|
| $C_4F_8$ Flow (sccm) | 10 |
| $O_2$ Flow (sccm) | 10 |
| $CH_2F_2$ Flow (sccm) | 10 |
| CO Flow (sccm) | 300 |
| Bias Power (W) | 1600 |
| Magnetic Field (G) | 60 |
| Pressure (mT) | 70 |
| Etch Rate (nm/min) | 600 |
| Photoresist Selectivity | 6 |
| Striations | slight |

The etch rate is increased over $C_4F_6$, and the profile and the silicon selectivity are about the same. However, the photoresist selectivity is significantly degraded and striations are observed. The ranges for the three components $C_4F_8$, $O_2$, and $CH_2F_2$ should be the same as for the $C_4F_6$ recipe, but the ratio range for CO should be increased to 30 to 60.

A third recipe was developed for carbon tetrafluoride ($CF_4$) as the primary etchant and is summarized in TABLE 3.

TABLE 3

| | |
|---|---|
| $CF_4$ Flow (sccm) | 30 |
| $O_2$ Flow (sccm) | 10 |
| $CH_2F_2$ Flow (sccm) | 25 |
| CO Flow (sccm) | 300 |
| Bias Power (W) | 1600 |
| Magnetic Field (G) | 45 |
| Pressure (mT) | 70 |
| Etch Rate (nm/min) | 500 |
| Photoresist Selectivity | 5 |
| Striations | severe |

The photoresist selectivity is reduced even further, and striations become more severe. Furthermore, bowing in the oxide is observed although the nitride profile is vertical. Although the results are degraded from the heavy fluorocarbons, compared to a standard $CF_4$ recipe, the results are much improved. This recipe is characterized similarly to the previous two except that the amount of $O_2$ is reduced by about half A recipe was attempted using trifluoromethane ($CHF_3$) as the primary etchant. Reasonable results were obtained with this hydrofluorocarbon, but not nearly as good as for the above recipes.

The recipes are not limited to the quoted values. Around the stated baseline, it is believed that a process window extends from 50 to 80 milliTorr of chamber pressure, 1300 to 1800W of RF power delivered to the pedestal for a 200 mm wafer, and 30 to 70 gauss of magnetic field.

The invention has also been applied to a $CH_3$-doped, low-k dielectric material developed and marketed by Applied Materials under the name of Black Diamond and by Novellus under the name of Coral for a somewhat different material. Both materials are a type of an organo-silicate glass (OSG) grown by chemical vapor deposition by oxidizing methyl silane in the case of Black Diamond, as disclosed by Yau et al. in U.S. patent applications Ser. Nos. 09/021,788, filed Feb. 11, 1998 and 09/114,682, filed Jul. 13, 1998. The number of methyl radicals in this and related materials may vary from one to four for a monosilane. In U.S. patent application Ser. No. 09/200,086 filed Nov. 25, 1998, Li et al. disclose an atomic composition of Black Diamond material, as summarized in TABLE 4 although Lau et al. suggest a very broad range of compositions.

TABLE 4

| | Atomic Percentage |
|---|---|
| H | 52 |
| C | 8 |
| Si | 19 |
| O | 21 |

Li et al. disclose various etching recipes for etching such an organo-silicate glass in one-and two-step processes. Those involving $C_4F_8$ in the etchant gas additionally include $CHF_3$, CO, and Ar.

We have applied the $C_4F_6$ recipe of TABLE 1 to etching this organo silicate glass and found that it etches the organo silicate glass highly selectively to both photoresist and to silicon carbide, which is often used as an etch stop layer in OSG structures because of its lower dielectric constant of 2.5 relative to silicon nitride. However, in view of the good results for etching oxide and nitride it is fully expected that the same recipes are also effective at etching OSG and nitride, between which the selectivity should be about 2:1.

Although $C_4F_6$, having an F/C-ratio of 1.5, seems to give the best results, other hydrogen-free heavy fluorocarbons of three or more carbons and having similarly low F/C ratios of less than 2.0 should also be usable for an oxide/nitride etch using the above recipes as guidance. One such fluorocarbon is octafluoropentadiene ($C_5F_8$) with an F/C ratio of 1.6. Hexafluorobenzene ($C_6F_6$) has an advantageously very low F/C-ratio but is too viscous to be easily used. As described above, $C_4F_8$, with an F/C-ratio of 2.0 can be used with the invention, but yet lower F/C-ratios seem more useful.

The above etch process was described with reference to an oxide layer overlying a nitride layer or an OSG layer overlying a silicon carbide layer. In both cases, a silicon oxide layer overlies a non-oxide silicon compound layer. However, the same recipe applies equally well to any sequence of these materials, particularly overlying silicon.

The invention is advantageously practiced in a diode reactor although similarly good results are expected if a more complicated inductively coupled etch reactor capable of producing a high-density plasma.

The invention thus allows a one-step etch process that is highly selective to both photoresist and silicon and does not suffer from undue striations. However, it is possible to optimize the etching conditions for different portions of the hole being etched.

What is claimed is:

1. A plasma etch process for etching oxide and nitride selectively over silicon and photoresist, comprising the steps of:
   placing in a plasma etch chamber a substrate having a silicon layer overlaid by a nitride layer and an oxide layer and a patterned photosist layer overlying said oxide, nitride, and silicon layers;
   flowing into said chamber an etching gas mixture comprising a first amount of a fluorocarbon selected from the group consisting of $C_4F_6$ and $C_5F_8$, a second amount of oxygen, a third amount of difluoromethane, and a fourth amount of carbon monoxide; and
   exciting said etching gas into a plasma to etch said oxide and nitride layers selectively to said silicon and photoresist layers.

2. The process of claim 1, wherein said exciting step etches said oxide layer selectively to said photoresist layer with a selectivity of at least 6.

3. The process of claim 1, wherein said exciting step selectively etches said oxide layer selectively to said silicon layer with a selectivity of at least 20.

4. The process of claim 1, wherein said exciting step selectively etches said oxide layer relative to said nitride layer with a selectivity of no more than 5.

5. The process of claim 1, wherein said fluorocarbon comprises $C_4F_6$.

6. The process of claim 1, wherein a flow ratio of said fourth amount to said first amount is at least 5.

7. The process of claim 1, wherein said etching gas mixture includes substantially no argon.

8. The process of claim 1, wherein said fluorocarbon comprises $C_5F_8$.

9. The process of claim 1, further comprising applying a substantially DC magnetic field in said chamber.

10. The process of claim 9, wherein said exciting step consists of capacitively coupling RF power into said chamber.

11. The process of claim 1, wherein a flow ratio of said first amount to said second amount lies in a range of 4:1 to 1:4.

12. The process of claim 11, wherein said flow ratio lies in a range of 2:1 to 1:2.

13. A plasma etch process for etching oxide and nitride selectively over silicon and photoresist, comprising the steps of:
   placing in a plasma etch chamber a substrate having a silicon layer overlaid by a nitride layer and an oxide layer and a patterned photoresist layer overlying said oxide, nitride, and silicon layers;
   flowing into said chamber an etching gas mixture comprising a first amount of a fluorocarbon selected from the group consisting of $C_4F_6$ and $C_5F_8$, a second amount of oxygen, a third amount of difluoromethane, and a fourth amount of carbon monoxide, wherein ratios of said first amount to said second amount, of said first amount to said third amount, arid of said second amount to said third amount all lie within a range of 1:2 and 2:1 and wherein a ratio of said fourth amount to said first amount is at least 10; and
   exciting said etching gas into a plasma to etch said oxide and nitride layers selectively to said silicon and photoresist layers.

14. The process of claim 13, wherein said fluorocarbon comprises hexafluorobutadiene.

15. The process of claim 13, wherein said fluorocarbon comprises $C_5F_8$.

16. A process for etching a substrate comprising from the top downwards a patterned photoresist layer, a dielectric layer composed of a second material selected from the group consisting of silicon oxide and an organo-silicate glass, a non-oxide silicon compound layer composed of a second material selected from the group consisting of silicon nitride and silicon carbide, and a silicon layer, said process comprising the steps of:
   flowing into a chamber containing said substrate an etching gas mixture comprising a first amount of a fluorocarbon selected from the group consisting of $C_4F_6$ and $C_5F_8$, a second amount of oxygen, a third amount of difluoromethane, and a fourth amount of carbon monoxide; and
   exciting said etching gas into a plasma to etch said substrate with a first selectivity of etching said dielectric layer to said photoresist layer, with a second selectivity of etching said dielectric layer to said silicon compound layer, and a third selectivity of etching said oxide layer to said silicon layer, said second selectivity being lower than either of said first and third selectivities.

17. The process of claim 16, wherein said etching gas mixture includes substantially no argon.

18. The process of claim 16, wherein ratios between all of said first, second, and third amounts lie in a range of 1:4 and 4:1 and ratios between said fourth amount and all of said first, second, and third amounts lie in a range between 5 and 50.

19. The process of claim 16, wherein said fluorocarbon comprises $C_4F_6$.

20. A plasma etch process for etching an organo silicate glass selectively over photoresist, comprising the steps of:
placing in a plasma etch chamber a substrate having an organo silicate glass layer overlaid by a patterned photoresist layer;
flowing into said chamber an etching gas mixture comprising a first amount of a fluorocarbon selected from the group consisting of $C_4F_6$ and $C_5F_8$, a second amount of oxygen, a third amount of difluoromethane, and a fourth amount of carbon monoxide; and
exciting said etching gas into a plasma to etch said organo silicate layer selectively to said photoresist layer.

21. The process of claim 20, Wherein a silicon carbide layer underlies said silicate glass layer and said plasma selectively etches said organo silicate glass layer to said silicon carbide layer.

22. The process of claim 20, wherein ratios between all of said first, second, and third amounts lie in a range of 1:4 and 4:1 and ratios between said fourth amount and all of said first, second, and third amounts lie in a range between 5 and 50.

23. The process of claim 20, wherein said fluorocarbon comprises $C_4F_6$.

* * * * *